(12) United States Patent
Khlat

(10) Patent No.: US 11,658,614 B2
(45) Date of Patent: May 23, 2023

(54) SUPPLY VOLTAGE CIRCUIT FOR REDUCING IN-RUSH BATTERY CURRENT IN AN ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 2 days.

(21) Appl. No.: 17/523,957

(22) Filed: Nov. 11, 2021

(65) Prior Publication Data

US 2022/0360224 A1    Nov. 10, 2022

Related U.S. Application Data

(60) Provisional application No. 63/185,957, filed on May 7, 2021, provisional application No. 63/185,939, filed on May 7, 2021.

(51) Int. Cl.
  *H03F 1/02* (2006.01)
  *H03F 3/04* (2006.01)

(52) U.S. Cl.
  CPC .............. *H03F 1/0216* (2013.01); *H03F 3/04* (2013.01); *H03F 2200/105* (2013.01)

(58) Field of Classification Search
  USPC .................................................. 330/297, 279
  See application file for complete search history.

(56) References Cited

U.S. PATENT DOCUMENTS 11,349,436 B2 *  5/2022  Khlat ...................... H03F 3/245

OTHER PUBLICATIONS

U.S. Appl. No. 17/523,999, filed Nov. 11, 2021.
U.S. Appl. No. 17/523,985, filed Nov. 11, 2021.
U.S. Appl. No. 17/523,966, filed Nov. 11, 2021.
U.S. Appl. No. 17/507,173, filed Oct. 21, 2021.

* cited by examiner

*Primary Examiner* — Hieu P Nguyen
(74) *Attorney, Agent, or Firm* — Withrow & Terranova, P.L.L.C.

(57) ABSTRACT

A supply voltage circuit for reducing in-rush battery current in an envelope tracking (ET) integrated circuit (ETIC) is provided. The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may result in a reduced battery life. In this regard, a supply voltage circuit is configured to help the ETIC to adapt the supply voltage on a per-symbol basis. As a result, it is possible to reduce the in-rush battery current in the ETIC while still allowing the time-variant ET voltage to change in a timely manner.

20 Claims, 4 Drawing Sheets

SUPPLY VOLTAGE CIRCUIT FOR REDUCING IN-RUSH BATTERY CURRENT IN AN ENVELOPE TRACKING INTEGRATED CIRCUIT

RELATED APPLICATIONS

This application claims the benefit of U.S. provisional patent application Ser. No. 63/185,957 filed on May 7, 2021, and U.S. provisional patent application Ser. No. 63/185,939 filed on May 7, 2021, the disclosures of which are incorporated herein by reference in their entireties.

FIELD OF THE DISCLOSURE

The technology of the disclosure relates generally to reducing in-rush battery current in an envelope tracking (ET) integrated circuit (ETIC).

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standard for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 µs.

TABLE 1

| SCS (KHz) | CP (µs) | OFDM Symbol Duration (µs) | Modulation Bandwidth (MHz) |
| --- | --- | --- | --- |
| 15 | 4.69 | 71.43 | 50 |
| 30 | 2.34 | 35.71 | 100 |
| 60 | 1.17 | 17.86 | 200 |
| 120 | 0.59 | 8.93 | 400 |

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols.

SUMMARY

Embodiments of the disclosure relate to a supply voltage circuit for reducing in-rush battery current in an envelope tracking (ET) integrated circuit (ETIC). The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may be generated in the ETIC to result in a reduced battery life. In this regard, a supply voltage circuit is configured according to embodiments disclosed herein to help the ETIC to adapt the supply voltage on a per-symbol basis to thereby avoid increasing or decreasing the offset voltage and the supply voltage in a same one of the time intervals. As a result, it is possible to reduce the in-rush battery current in the ETIC while still allowing the time-variant ET voltage to change in a timely manner.

In one aspect, an ETIC is provided. The ETIC includes an ET voltage circuit. The ET voltage circuit is configured to generate a time-variant ET voltage comprising an offset voltage in multiple time intervals based on a supply voltage. The multiple time intervals each include multiple symbols. The ETIC also includes a supply voltage circuit. The supply voltage circuit is configured to concurrently generate multiple supply voltages. The supply voltage circuit is also configured to provide a selected one of the multiple supply voltages to the ET voltage circuit as the supply voltage in each of the multiple symbols. The ETIC also includes a control circuit. The control circuit is configured to determine, in a first one of the multiple time intervals, that the supply voltage and the offset voltage are set to change in a same direction in a second one of the multiple time intervals immediately succeeding the first one of the multiple time intervals. The control circuit is also configured to cause one of the supply voltage and the offset voltage to change in the first one of the multiple time intervals. The control circuit is also configured to cause another one of the supply voltage and the offset voltage to change in the second one of the multiple time intervals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
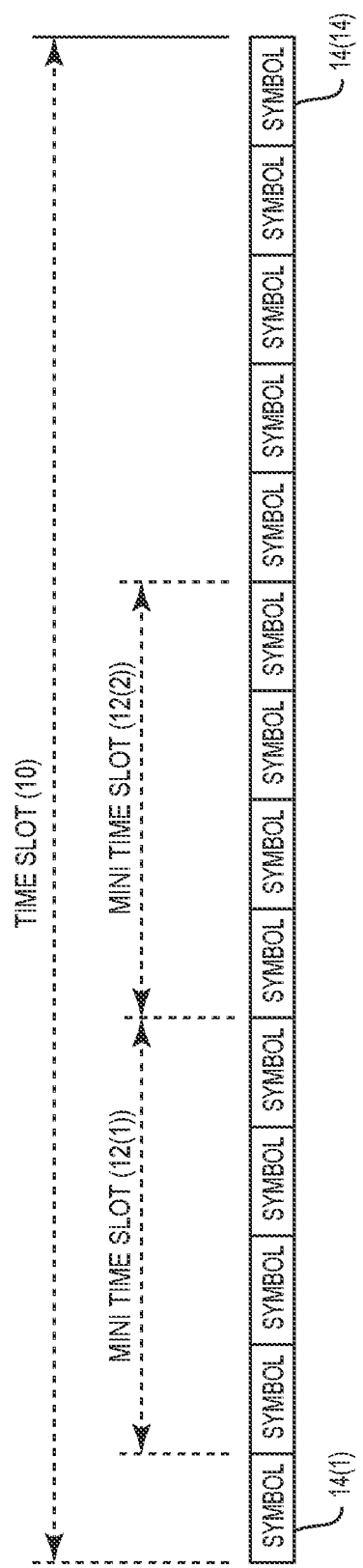
FIG. 1 illustrates an exemplary time slot(s) and a mini time slot(s) as widely supported in a fifth generation (5G) system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a supply voltage circuit for reducing in-rush battery current in an envelope tracking (ET) integrated circuit (ETIC). The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may be generated in the ETIC to result in a reduced battery life. In this regard, a supply voltage circuit is configured according to embodiments disclosed herein to help the ETIC to adapt the supply voltage on a per-symbol basis to thereby avoid increasing or decreasing the offset voltage and the supply voltage in a same one of the time intervals. As a result, it is possible to reduce the in-rush battery current in the ETIC while still allowing the time-variant ET voltage to change in a timely manner.

Figure 2:
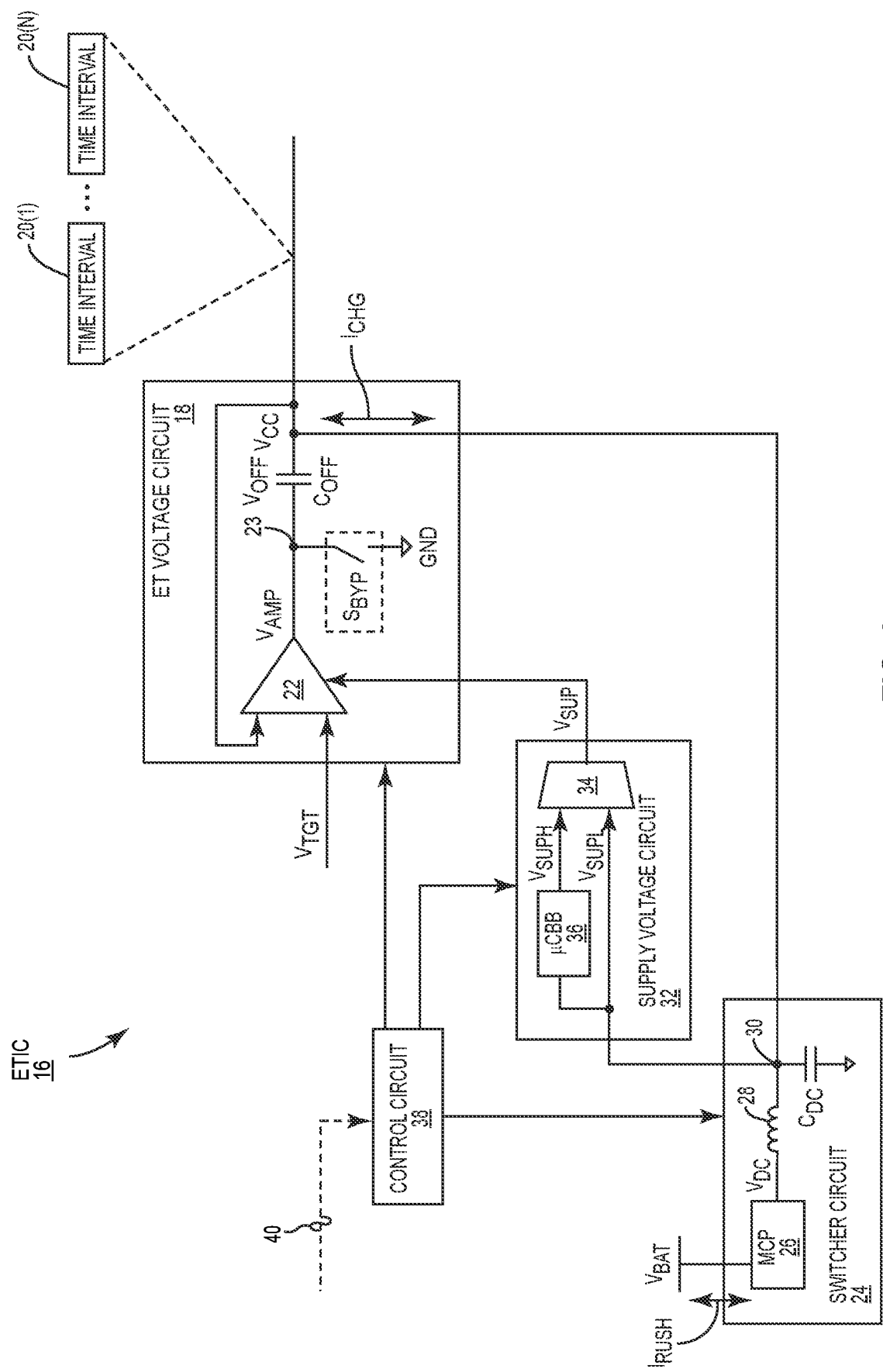
FIG. 2 is a schematic diagram of an exemplary envelope tracking (ET) integrated circuit (ETIC) configured according to embodiments of the present disclosure to reduce in-rush battery current.

Before discussing the supply voltage and the ETIC for reducing in-rush battery current according to the present disclosure, starting at FIG. 2, an overview of time slot and mini time slot, which can be used to define durations of the time intervals, is first provided with reference to FIG. 1.

FIG. 1 illustrates an exemplary time slot 10 and a pair of mini time slots 12(1)-12(2) as widely supported in a fifth generation (5G) system. The time slot(s) 10 is configured to include multiple symbols 14(1)-14(14), such as orthogonal frequency division multiplexing (OFDM) symbols. The mini time slots 12(1)-12(2) can each include at least two of the symbols 14(1)-14(14). In the example shown in FIG. 1, the mini time slots 12(1)-12(2) each includes four of the symbols 14(1)-14(14).

As previously shown in Table 1, each of the symbols 14(1)-14(14) has a symbol duration that depends on the subcarrier spacing (SCS). In this regard, once the SCS is chosen, the duration of the time slot 10 and the mini time slots 12(1)-12(2) will be set accordingly. In a non-limiting example, the duration of the time slot 10 or the duration the mini time slots 12(1)-12(2) can be used to define the duration of a time interval, which will be frequently referenced in embodiments discussed next.

FIG. 2 is a schematic diagram of an exemplary ETIC 16 configured according to embodiments of the present disclosure to reduce an in-rush battery current $I_{RUSH}$. Herein, the in-rush battery current $I_{RUSH}$ refers to an instantaneous current associated with charging or discharging a capacitor(s) in the ETIC 16. The in-rush battery current $I_{RUSH}$ can be bidirectional, meaning that the in-rush battery current $I_{RUSH}$ can either flow from a battery (not shown) toward the capacitor(s) when the capacitor(s) is charged or flow from the capacitor(s) toward the battery when the capacitor(s) is discharged. No matter what direction the in-rush battery current $I_{RUSH}$ flows, the battery can suffer a significant energy loss as a result. Understandably, the in-rush battery current $I_{RUSH}$ can become excessive when multiple capacitors are simultaneously charged or simultaneously discharged.

As discussed in detail below, the ETIC 16 can reduce the in-rush battery current $I_{RUSH}$ resulting from simultaneous charging or simultaneous discharging multiple capacitors. Specifically, the ETIC 16 can be configured to charge multiple capacitors or discharge multiple capacitors at different times. As a result, it is possible to reduce the in-rush battery current in the ETIC 16 to help prolong the life of the battery.

The ETIC 16 includes an ET voltage circuit 18 configured to generate a time-variant ET voltage $V_{CC}$ in a number of time intervals 20(1)-20(N) based on a supply voltage $V_{SUP}$. In a non-limiting example, each of the time intervals 20(1)-20(N) can be equivalent to the time slot 10 or any of the mini time slots 20(1)-20(2) in FIG. 1. In this regard, the time intervals 20(1)-20(N) can each include two or more of the symbols 14(1)-14(14) in FIG. 1.

The ET voltage circuit 18 includes a voltage amplifier 22 coupled in series to an offset capacitor $C_{OFF}$. The voltage amplifier 22 is configured to generate an initial ET voltage $V_{AMP}$ based on the supply voltage $V_{SUP}$ and a target voltage $V_{TGT}$. The offset capacitor $C_{OFF}$ is configured to raise the initial ET voltage $V_{AMP}$ by an offset voltage $V_{OFF}$ to generate the time-variant ET voltage $V_{CC}$ ($V_{CC}=V_{AMP}+V_{OFF}$). In this regard, the time-variant ET voltage $V_{CC}$ can be said to include the initial ET voltage $V_{AMP}$ and the offset voltage $V_{OFF}$. In an embodiment, the offset voltage $V_{OFF}$ can be modulated in accordance with equation (Eq. 1) below.

$$V_{OFF}=V_{CC\text{-}MIN}-N_{HEAD} \qquad (\text{Eq. 1})$$

In the equation (Eq. 1) above, $V_{CC\text{-}MIN}$ represents a minimum level of the time-variant ET voltage $V_{CC}$ in any of the time intervals 20(1)-20(N) and $N_{HEAD}$ represents a bottom headroom voltage. Given that $N_{HEAD}$ is typically fixed, the offset voltage $V_{OFF}$ will fluctuate in accordance with the $V_{CC\text{-}MIN}$. As such, the offset capacitor $C_{OFF}$ needs to be charged when the $V_{CC\text{-}MIN}$ increases and discharged when the $V_{CC\text{-}MIN}$ decreases.

The ET voltage circuit 18 can include a bypass switch $S_{BYP}$. The bypass switch $S_{BYP}$ is coupled between a middle node 23, which is located between the voltage amplifier 22 and the offset capacitor $C_{OFF}$, and a ground (GND). As discussed below, the bypass switch $S_{BYP}$ is closed to allow the offset capacitor $C_{OFF}$ to be charged and opened to allow the offset capacitor $C_{OFF}$ to be discharged.

The ETIC 16 also includes a switcher circuit 24 that is configured to modulate the offset voltage $V_{OFF}$. In a non-limiting example, the switcher circuit 24 includes a multi-level charge pump (MCP) 26, a power inductor 28, and a capacitor $C_{DC}$. The MCP 26 is configured to generate a low-frequency voltage $V_{DC}$ as a function of a battery voltage $V_{BAT}$. More specifically, the MCP 26 can be configured to toggle the low-frequency voltage $V_{DC}$ between $0\times V_{BAT}$ (0 V), $1\times V_{BAT}$, or $2\times V_{BAT}$ in accordance with a duty cycle. For example, if the battery voltage $V_{BAT}$ equals 5 V and the duty cycle is determined to be 30%@$0\times V_{BAT}$, 30%@$1\times V_{BAT}$, and 40%@$2\times V_{BAT}$, then the MCP 26 would generate the low-frequency voltage $V_{DC}$ at 5.5 V (0.3*5 V+0.4*10 V=5.5 V). As such, the MCP 26 can be configured to generate the low-frequency voltage $V_{DC}$ at different levels in accordance with different duty cycles.

The power inductor 28 is coupled between the MCP 26 and a reference node 30. The capacitor $C_{DC}$ is coupled between the reference node 30 and the GND. The power inductor 28 and the capacitor $C_{DC}$ collectively form an inductor-capacitor (LC) network that outputs an average of the low-frequency voltage $V_{DC}$ at the reference node 30.

The power inductor 28 is configured to induce a charge current $I_{CHG}$ based on the low-frequency voltage $V_{DC}$. When the $V_{CC\text{-}MIN}$ increases and the bypass switch $C_{BYP}$ is closed, the charge current $I_{CHG}$ flows from the power inductor 28 toward the offset capacitor $C_{OFF}$ to cause the offset capacitor $C_{OFF}$ to be charged. When the $V_{CC\text{-}MIN}$ decreases and the bypass switch $C_{BYP}$ is opened, the charge current $I_{CHG}$ flows from the offset capacitor $C_{OFF}$ toward the power inductor 28 to cause the offset capacitor $C_{OFF}$ to be discharged. In this regard, the charge current $I_{CHG}$ can cause the offset voltage $V_{OFF}$ to be modulated in accordance with the equation (Eq. 1). Understandably, since the charge current $I_{CHG}$ can cause the offset capacitor $C_{OFF}$ to be charged or discharged, the offset capacitor $C_{OFF}$ can cause the overall in-rush battery current $I_{RUSH}$ to increase in the ETIC 16.

The ETIC 16 also includes a supply voltage circuit 32 configured to provide the supply voltage $V_{SUP}$ to the voltage amplifier 22. In a non-limiting example, the supply voltage circuit 32 is configured to concurrently generate at least one high supply voltage $V_{SUPH}$ and a low supply voltage $V_{SUPL}$, which is lower than the high supply voltage $V_{SUPH}$. However, only one of the high supply voltage $V_{SUPH}$ and the low supply voltage $V_{SUPL}$ will be outputted by an output circuit 34 as the supply voltage $V_{SUP}$ at any given time. In an embodiment, the high supply voltage $V_{SUPH}$ and the low supply voltage $V_{SUPL}$ are generated in accordance with the equations (Eq. 2 and Eq. 3) below.

$$V_{SUPH}=V_{CC\text{-}MAX}-V_{CC\text{-}MIN}+N_{HEAD}+P_{HEAD} \qquad (\text{Eq. 2})$$

$$V_{SUPL}=V_{SUPH}/\mu\text{Ratio} \qquad (\text{Eq. 3})$$

In the equations above, $V_{CC\text{-}MAX}$ represents a maximum level of the time-variant ET voltage $V_{CC}$ in any of the time intervals 20(1)-20(N), $P_{HEAD}$ represents an upper headroom voltage, and μRatio represents a conversion ratio that is greater than 1 (μRatio>1). Given that $N_{HEAD}$, $P_{HEAD}$, and μRatio are typically fixed, the high supply voltage $V_{SUPH}$ and the low supply voltage $V_{SUPL}$ will fluctuate in accordance with the $V_{CC\text{-}MAX}$ and/or the $V_{CC\text{-}MIN}$.

In an embodiment, the supply voltage circuit 32 also includes a micro capacitor-based buck-boost circuit 36 (denoted as "μCBB"). The micro capacitor-based buck-boost circuit 36 is coupled between the reference node 30 and the output circuit 34 and is configured to generate the high supply voltage $V_{SUPH}$ by multiplying the low-frequency voltage $V_{DC}$ by the conversion ratio μRatio. The low supply voltage $V_{SUPL}$, on the other hand, is generated based on the equation (Eq. 3) above.

Figure 4:
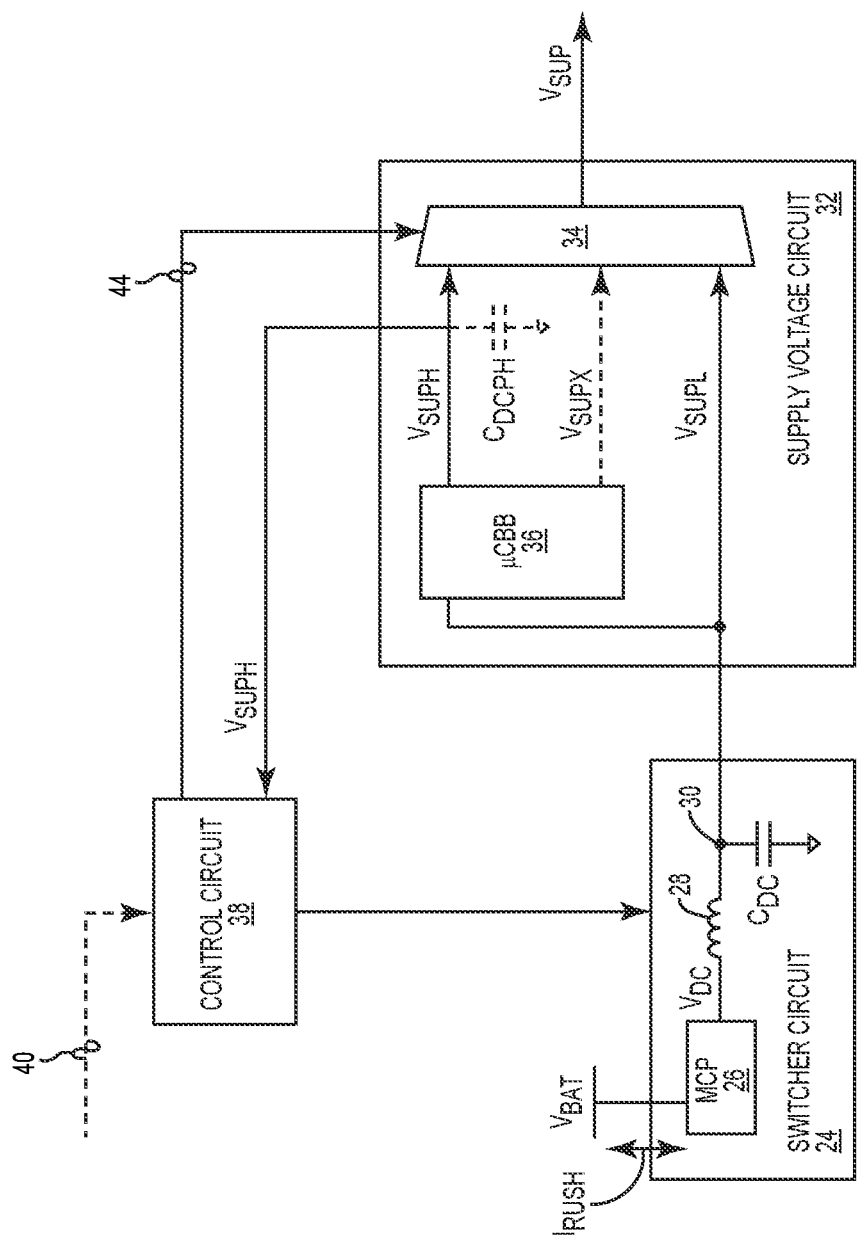
FIG. 4 is a schematic diagram of an exemplary supply voltage circuit that can be employed in the ETIC of FIG. 2 to help reduce the in-rush battery current.

The supply voltage circuit 32 may include a decoupling capacitor $C_{DCPH}$ (shown in FIG. 4) to help provide isolation between the supply voltage circuit 32 and the power inductor 28. As shown in FIG. 4, the decoupling capacitor $C_{DCPH}$ can be coupled between an output of the micro capacitor-based buck-boost circuit 36 and the GND. Understandably, the decoupling capacitor $C_{DCPH}$ may also contribute to the overall in-rush battery current $I_{RUSH}$ in the ETIC 16. Thus, to help reduce the overall in-rush battery current $I_{RUSH}$ caused by charging and discharging of the offset capacitor $C_{OFF}$ and the decoupling capacitor $C_{DCPH}$, the ETIC 16 is configured to avoid increasing or decreasing both the offset voltage $V_{OFF}$ and the supply voltage $V_{SUP}$ at the same time.

In this regard, the ETIC 16 is further configured to include a control circuit 38, which can be a field-programmable gate array (FPGA) as an example. The control circuit 38 is coupled to and configured to control the ET voltage circuit 18, the switcher circuit 24, and the supply voltage circuit 32. In an embodiment, the control circuit 38 is configured to determine, in a first one of the time intervals 20(1)-20(N), that the supply voltage $V_{SUP}$ and the offset voltage $V_{OFF}$ are set to change in a same direction in a second one of the time intervals 20(1)-20(N) immediately succeeding the first one of the time intervals 20(1)-20(N).

Herein, the supply voltage $V_{SUP}$ and the offset voltage $V_{OFF}$ are said to change in the same direction when both the supply voltage $V_{SUP}$ and the offset voltage $V_{OFF}$ are set to increase at the same time or to decrease at the same time. In contrast, if one of the supply voltage $V_{SUP}$ and the offset voltage $V_{OFF}$ is set to increase and another one of the supply voltage $V_{SUP}$ and the offset voltage $V_{OFF}$ is set to decrease at the same time, the supply voltage $V_{SUP}$ and the offset voltage $V_{OFF}$ are said to change in a different direction.

In response to determining that the supply voltage $V_{SUP}$ and the offset voltage $V_{OFF}$ are set to increase in the same direction in the second one of the time intervals 20(1)-20(N), the control circuit 38 is configured to cause one of the supply voltage $V_{SUP}$ and the offset voltage $V_{OFF}$ to change in the first one of the time intervals 20(1)-20(N), and cause another one of the supply voltage $V_{SUP}$ and the offset voltage $V_{OFF}$ to change in the second one of the time intervals 20(1)-20(N). By making the supply voltage $V_{SUP}$ and the offset voltage $V_{OFF}$ change in different ones of the time intervals 20(1)-20(N), it is thus possible to reduce the overall in-rush battery current $I_{RUSH}$ in each of the time intervals 20(1)-20(N).

The control circuit 38 may determine whether the supply voltage $V_{SUP}$ and the offset voltage $V_{OFF}$ are set to change in the same direction or in a different direction in any of the time intervals 20(1)-20(N) based on an indication signal 40, which can be provided by a transceiver circuit (not shown), as an example. In a non-limiting example, the indication signal 40 can also help the control circuit 38 to determine how the time-variant ET voltage $V_{CC}$, and accordingly how the initial ET voltage $V_{AMP}$, the offset voltage $V_{OFF}$, and the supply voltage $V_{SUP}$, will change in each of the time intervals 20(1)-20(N).

Figure 3:
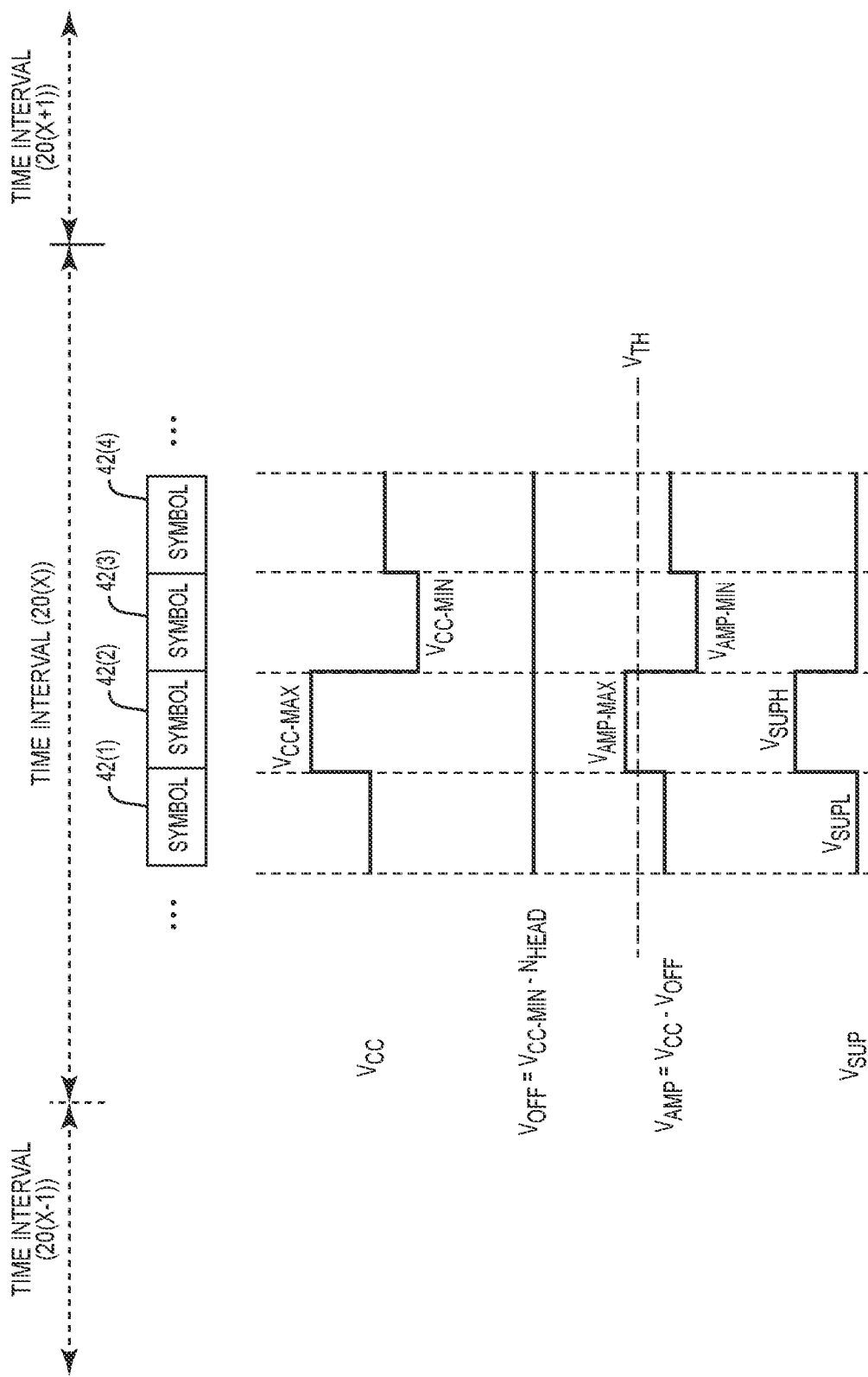
FIG. 3 is a diagram providing an exemplary illustration as to how to determine various voltage changes to help reduce the in-rush battery current in the ETIC of FIG. 2.

In this regard, FIG. 3 is a diagram providing an exemplary illustration as to how the control circuit 38 can determine various voltage changes in any of the time intervals 20(1)-20(N) to help reduce the overall in-rush battery current $I_{RUSH}$ in the ETIC 16 of FIG. 2. Notably, the time interval 20(X) illustrated in FIG. 3 can represent any of the time intervals 20(1)-20(N). The time interval 20(X) is also shown to include multiple consecutive symbols 42(1)-42(4), which can be among the symbols 14(1)-14(14) in FIG. 1. The time interval 20(X) is preceded by an immediately preceding time interval 20(X−1) and succeeded by an immediately succeeding time interval 20(X+1).

As shown in FIG. 3, the control circuit 38 can determine a maximum level ($V_{CC-MAX}$) and a minimum level ($V_{CC-MIN}$) of the time-variant ET voltage $V_{CC}$ during the time interval 20(X). Accordingly, the control circuit 38 can determine the offset voltage $V_{OFF}$ based on the equation (Eq. 1). Thus, by comparing the determined offset voltage $V_{OFF}$ against a respective offset voltage $V_{OFF}$ set in the immediately preceding time interval 20(X−1), the control circuit 38 can determine whether the offset voltage $V_{OFF}$ needs to be increased or decreased. In addition, the control circuit 38 may also learn (e.g., via the indication signal 40) about a root-to-mean square (RMS) power level in the time interval 20(X). Accordingly, the control circuit 38 can determine an average current level required to charge or discharge the offset capacitor $C_{OFF}$ to the determined offset voltage $V_{OFF}$ in the time interval 20(X).

Further, the control circuit 38 can determine a maximum initial ET voltage $V_{AMP-MAX}$ based on the maximum level ($V_{CC-MAX}$) of the time-variant ET voltage and the determined offset voltage $V_{OFF}$ ($V_{AMP-MAX}=V_{CC-MAX}-V_{OFF}$). Likewise, the control circuit 38 can determine a minimum initial ET voltage $V_{AMP-MIN}$ based on the minimum level ($V_{CC-MIN}$) of the time-variant ET voltage and the determined offset voltage $V_{OFF}$ ($V_{AMP-MIN}=V_{CC-MIN}-V_{OFF}$).

The control circuit 38 can compare the maximum initial ET voltage $V_{AMP-MAX}$, or alternatively, an average of the initial ET voltage $V_{AMP}$, during the time interval 20(X) against a threshold voltage $V_{TH}$ to determine whether the supply voltage $V_{SUP}$ should be increased or decreased. In addition, the control circuit 38 needs to determine whether the initial ET voltage $V_{AMP}$ in the immediately preceding time interval 20(X−1) is above or below the threshold voltage $V_{TH}$. If the initial ET voltage $V_{AMP}$ in the immediately preceding time interval 20(X−1) is lower than the threshold voltage $V_{TH}$ and the initial ET voltage $V_{AMP}$ in the time interval 20(X) is higher than or equal to the threshold voltage $V_{TH}$, the control circuit 38 can thus conclude that the supply voltage $V_{SUP}$ is set to increase in the time interval 20(X). In contrast, if the initial ET voltage $V_{AMP}$ in the immediately preceding time interval 20(X−1) is higher than or equal to the threshold voltage $V_{TH}$ and the initial ET voltage $V_{AMP}$ in the time interval 20(X) is lower than the threshold voltage $V_{TH}$, the control circuit 38 can thus conclude that the supply voltage $V_{SUP}$ is set to decrease in the time interval 20(X).

In an embodiment, the control circuit 38 can control the supply voltage circuit 32 to provide the high supply voltage $V_{SUPH}$ to the voltage amplifier 22 in response to determining that the supply voltage $V_{SUP}$ is set to increase in the time interval 20(X). In contrast, the control circuit 38 can control the supply voltage circuit 32 to provide the low supply voltage $V_{SUPL}$ to the voltage amplifier 22 in response to determining that the supply voltage $V_{SUP}$ is set to decrease in the time interval 20(X). The control circuit 38 can also determine the high supply voltage $V_{SUPH}$ and the low supply voltage $V_{SUPL}$ based on the equations (Eq. 2 and Eq. 3).

It should be appreciated that the control circuit 38 can also determine, in the time interval 20(X), the maximum level ($V_{CC-MAX}$) and minimum level ($V_{CC-MIN}$) of the time-variant ET voltage $V_{CC}$, the offset voltage $V_{OFF}$, the maximum initial ET voltage $V_{AMP-MAX}$, the minimum initial ET voltage $V_{AMP-MIN}$, the high supply voltage $V_{SUPH}$, and the low supply voltage $V_{SUPL}$ in the immediately succeeding time interval 20(X+1) based on the same steps as described above.

As mentioned earlier, the time intervals 20(1)-20(N) can each include two or more of the symbols 14(1)-14(14) in FIG. 1. As such, the supply voltage circuit 32 needs to be able to toggle between the low supply voltage $V_{SUPL}$ and the high supply voltage $V_{SUPH}$ on a per-symbol basis to help reduce the in-rush battery current $I_{RUSH}$ in the ETIC 16. In this regard, FIG. 4 is a schematic diagram of the supply voltage circuit 32 provided in the ETIC 16 of FIG. 2 to help reduce the in-rush battery current $I_{RUSH}$. Common elements between FIGS. 2 and 4 are shown therein with common element numbers and will not be re-described herein.

The output circuit 34 is coupled to the reference node 30 to thereby receive the average of the low-frequency voltage $V_{DC}$ as the low supply voltage $V_{SUPL}$. The micro capacitor-based buck-boost circuit 36 is configured to boost the low supply voltage $V_{SUPL}$ by the conversion ratio μRatio to thereby provide the high supply voltage $V_{SUPH}$ to the output circuit 34 as well. The control circuit 38 may control the output circuit 34 (e.g., via a control signal 44) to output a selected one of the high supply voltage $V_{SUPH}$ and the low supply voltage $V_{SUPL}$ as the supply voltage $V_{SUP}$ in each of the symbols 14(1)-14(14) during any of the time intervals 20(1)-20(N).

In an embodiment, the control circuit 38 can receive a target of the high supply voltage $V_{SUPH}$ in a respective one of the symbols 14(1)-14(14) during any of the time intervals 20(1)-20(N). In a non-limiting example, the control circuit 38 can receive the target of the high supply voltage $V_{SUPH}$ via the indication signal 40. The control circuit 38 may also receive a feedback of the high supply voltage $V_{SUPH}$ in the respective one of the symbols 14(1)-14(14). Accordingly, the control circuit 38 can compare the target of the high supply voltage $V_{SUPH}$ with the feedback of the high supply voltage $V_{SUPH}$ to detect any deviation of the high supply voltage $V_{SUPH}$. Should the control circuit 38 detect any deviation between the high supply voltage $V_{SUPH}$ and the target of the high supply voltage $V_{SUPH}$, the control circuit 38 can adjust the duty cycle of the MCP 26 to thereby cause the average of the low-frequency voltage $V_{DC}$ (a.k.a. the low supply voltage $V_{SUPL}$) to be adjusted at the reference node 30. In an embodiment, the control circuit 38 can adjust the duty cycle such that the low supply voltage $V_{SUPL}$ at the reference node 30 can be equal to the target of the high supply voltage $V_{SUPH}$ divided by the conversion ratio μRatio. As a result, it is possible to maintain alignment between the high supply voltage $V_{SUPH}$ and the target of the high supply voltage $V_{SUPH}$ in the respective one of the symbols 14(1)-14(14).

The control circuit 38 may determine, during a present one of the symbols 14(1)-14(14) or a present one of the time intervals 20(1)-20(N), that the low supply voltage $V_{SUPL}$ is set to change in an immediately succeeding one of the symbols 14(1)-14(14) or an immediately succeeding one of the time intervals 20(1)-20(N). The control circuit 38 can determine the change of the low supply voltage $V_{SUPL}$ based on the indication signal 40, as an example. In an embodiment, the control circuit 38 may reconfigure the conversion ratio μRatio during the present one of the symbols 14(1)-14(14) or the present one of the time intervals 20(1)-20(N) based on the low supply voltage $V_{SUPL}$ to be set in the immediately succeeding one of the symbols 14(1)-14(14) or the immediately succeeding one of the time intervals 20(1)-20(N). By changing the conversion ratio μRatio early, it is possible to provide sufficient settling time for the low supply voltage $V_{SUPL}$ in the immediately succeeding one of the symbols 14(1)-14(14) or the immediately succeeding one of the time intervals 20(1)-20(N), without impacting the high supply voltage $V_{SUPH}$ in the present one of the symbols 14(1)-14(14) or the present one of the time intervals 20(1)-20(N).

In an embodiment, the micro capacitor-based buck-boost circuit 36 can be further configured to generate at least one medium supply voltage $V_{SUPX}$ (e.g., based on at least one second conversion ratio). The medium supply voltage $V_{SUPX}$ is higher than the low supply voltage $V_{SUPL}$ but lower than the high supply voltage $V_{SUPH}$ ($V_{SUPL}<V_{SUPX}<V_{SUPH}$). In this regard, the control circuit 38 can control the output circuit 34 to output a selected one of the low supply voltage $V_{SUPL}$, the medium supply voltage $V_{SUPX}$, and the high supply voltage $V_{SUPH}$ as the supply voltage $V_{SUP}$ in any of the symbols 14(1)-14(14) of any of the time intervals 20(1)-20(N).

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
   an ET voltage circuit configured to generate a time-variant ET voltage comprising an offset voltage in a plurality of time intervals based on a supply voltage, wherein the plurality of time intervals each comprises a plurality of symbols;
   a supply voltage circuit configured to:
   generate concurrently a plurality of supply voltages; and
   provide a selected one of the plurality of supply voltages to the ET voltage circuit as the supply voltage in each of the plurality of symbols; and
   a control circuit configured to:
   determine, in a first one of the plurality of time intervals, that the supply voltage and the offset voltage are set to change in a same direction in a second one of the plurality of time intervals immediately succeeding the first one of the plurality of time intervals;
   cause one of the supply voltage and the offset voltage to change in the first one of the plurality of time intervals; and
   cause another one of the supply voltage and the offset voltage to change in the second one of the plurality of time intervals.

2. The ETIC of claim 1, wherein the plurality of supply voltages comprises a high supply voltage and a low supply voltage that is lower than or equal to the high supply voltage.

3. The ETIC of claim 2, wherein the plurality of supply voltages further comprises at least one medium supply voltage, the at least one medium supply voltage is higher than the low supply voltage and lower than the high supply voltage.

4. The ETIC of claim 2, wherein the low supply voltage is equal to the high supply voltage divided by a conversion ratio greater than or equal to one.

5. The ETIC of claim 4, wherein the high supply voltage is expressed as: $V_{CC\text{-}MAX}-V_{CC\text{-}MIN}+N_{HEAD}+P_{HEAD}$, wherein:
   $V_{CC\text{-}MAX}$ represents a maximum level of the time-variant ET voltage in a respective one of the plurality of time intervals;
   $V_{CC\text{-}MIN}$ represents a minimum level of the time-variant ET voltage in the respective one of the plurality of time intervals;
   $N_{HEAD}$ represents a bottom headroom voltage; and
   $P_{HEAD}$ represents an upper headroom voltage.

6. The ETIC of claim 4, wherein the supply voltage circuit comprises:
   a micro capacitor-based buck-boost circuit configured to boost the low supply voltage by the conversion ratio to thereby generate the high supply voltage; and
   an output circuit coupled to the ET voltage circuit and configured to:

receive the low supply voltage and the high supply voltage; and output a selected one of the low supply voltage and the high supply voltage to the ET voltage circuit in each of the plurality of symbols.

7. The ETIC of claim 6, further comprising a switcher circuit comprising:

a multi-level charge pump (MCP) configured to generate a low-frequency voltage as a function of a battery voltage and in accordance with a duty cycle in each of the plurality of time intervals; and an inductor-capacitor (LC) circuit configured to output the low supply voltage as an average of the low-frequency voltage.

8. The ETIC of claim 7, wherein the control circuit is further configured to:

receive a target of the high supply voltage in a respective one of the plurality of symbols;

receive a feedback of the high supply voltage in the respective one of the plurality of symbols;

detect a deviation between the target of the high supply voltage and the feedback of the high supply voltage; and determine the duty cycle based on the detected deviation to cause the MCP to adjust the low-frequency voltage to thereby eliminate the detected deviation in the respective one of the plurality of symbols.

9. The ETIC of claim 8, wherein the control circuit is further configured to:

determine that the low supply voltage is set to change in a succeeding one of the plurality of symbols that immediately succeeds the respective one of the plurality of symbols; and reconfigure the conversion ratio during the respective one of the plurality of symbols based on the low supply voltage to be set in the succeeding one of the plurality of symbols.

10. The ETIC of claim 9, wherein the control circuit is further configured to determine the supply voltage in the succeeding one of the plurality of symbols based on an indication signal.

11. The ETIC of claim 7, wherein the ET voltage circuit comprises:

a voltage amplifier configured to generate an initial ET voltage based on the supply voltage; and an offset capacitor configured to raise the initial ET voltage by the offset voltage to generate the time-variant ET voltage in each of the plurality of time intervals.

12. The ETIC of claim 11, wherein the offset voltage is equal to $V_{CC\text{-}MIN}-N_{HEAD}$, wherein:

$V_{CC\text{-}MIN}$ represents a minimum level of the time-variant ET voltage in each of the plurality of time intervals; and $N_{HEAD}$ represents a bottom headroom voltage.

13. The ETIC of claim 11, wherein the supply voltage circuit is further configured to provide the supply voltage to the voltage amplifier in each of the plurality of symbols.

14. The ETIC of claim 11, wherein the switcher circuit is configured to generate a charge current to charge the offset capacitor to thereby modulate the offset voltage in each of the plurality of time intervals.

15. The ETIC of claim 14, wherein the LC circuit comprises a power inductor coupled to the offset capacitor and is configured to induce the charge current based on the low-frequency voltage.

16. The ETIC of claim 1, wherein the control circuit is further configured to:

determine, in the first one of the plurality of time intervals, that the supply voltage and the offset voltage are both set to decrease in the second one of the plurality of time intervals;

cause the offset voltage to decrease in a last one of the plurality of symbols comprised in the first one of the plurality of time intervals; and cause the supply voltage to decrease in a first one of the plurality of symbols comprised in the second one of the plurality of time intervals.

17. The ETIC of claim 1, wherein the control circuit is further configured to:

determine, in the first one of the plurality of time intervals, that the supply voltage and the offset voltage are both set to increase in the second one of the plurality of time intervals;

cause the offset voltage to increase in a first one of the plurality of symbols comprised in the second one of the plurality of time intervals; and cause the supply voltage to increase in a last one of the plurality of symbols comprised in the first one of the plurality of time intervals.

18. The ETIC of claim 1, wherein the control circuit is further configured to:

determine, in the first one of the plurality of time intervals, that the supply voltage and the offset voltage are set to change in a different direction in the second one of the plurality of time intervals; and cause one of the supply voltage and the offset voltage to concurrently change in any one of the first one of the plurality of time intervals and the second one of the plurality of time intervals.

19. The ETIC of claim 18, wherein the control circuit is further configured to:

determine, in the first one of the plurality of time intervals, that the supply voltage is set to decrease and the offset voltage is set to increase in the second one of the plurality of time intervals; and cause the supply voltage to decrease and the offset voltage to increase concurrently in a first one of the plurality of symbols comprised in the second one of the plurality of time intervals.

20. The ETIC of claim 18, wherein the control circuit is further configured to:

determine, in the first one of the plurality of time intervals, that the supply voltage is set to increase and the offset voltage is set to decrease in the second one of the plurality of time intervals; and cause the supply voltage to increase and the offset voltage to decrease concurrently in a last one of the plurality of symbols comprised in the first one of the plurality of time intervals.

* * * * *